United States Patent
Wang et al.

(10) Patent No.: US 10,431,515 B2
(45) Date of Patent: Oct. 1, 2019

(54) METHODS AND APPARATUS FOR SELF-ALIGNMENT OF INTEGRATED CIRCUIT DIES

(71) Applicant: Marvell World Trade Ltd., St. Michael (BB)

(72) Inventors: Long-Ching Wang, Cupertino, CA (US); Marc Jacobs, Redwood City, CA (US)

(73) Assignee: Marvell World Trade Ltd., St. Michael (BB)

( * ) Notice: Subject to any disclaimer, the term of this patent is extended or adjusted under 35 U.S.C. 154(b) by 93 days.

(21) Appl. No.: 15/697,230

(22) Filed: Sep. 6, 2017

(65) Prior Publication Data

US 2018/0068921 A1    Mar. 8, 2018

Related U.S. Application Data

(60) Provisional application No. 62/383,921, filed on Sep. 6, 2016.

(51) Int. Cl.
| | |
|---|---|
| *H01L 23/02* | (2006.01) |
| *H01L 23/31* | (2006.01) |
| *G06K 19/077* | (2006.01) |
| *H01L 23/00* | (2006.01) |
| *H01L 25/065* | (2006.01) |
| *H01L 25/00* | (2006.01) |

(52) U.S. Cl.
CPC .... *H01L 23/3157* (2013.01); *G06K 19/07745* (2013.01); *H01L 24/16* (2013.01); *H01L 24/24* (2013.01); *H01L 24/82* (2013.01); *H01L 24/83* (2013.01); *H01L 24/96* (2013.01); *H01L 24/97* (2013.01); *H01L 25/0657* (2013.01); *H01L 25/50* (2013.01); *H01L 2224/29099* (2013.01); *H01L 2224/83002* (2013.01); *H01L 2224/83143* (2013.01); *H01L 2224/83192* (2013.01); *H01L 2224/95146* (2013.01); *H01L 2224/97* (2013.01)

(58) Field of Classification Search
CPC ..... H01L 23/3157; H01L 24/16; H01L 24/24; H01L 24/82; H01L 24/83; H01L 24/96; H01L 24/97; H01L 25/0657; H01L 25/50
USPC .......................................................... 257/678
See application file for complete search history.

(56) References Cited

U.S. PATENT DOCUMENTS

2010/0029059 A1*    2/2010  Matsumura ........... C08F 220/18
                                                                438/464

* cited by examiner

*Primary Examiner* — Brook Kebede

(57) ABSTRACT

The present disclosure describes apparatuses and techniques for self-aligning integrated circuit (IC) dies. In some aspects, a hydrophobic material is deposited on a surface of a substrate to form a pattern on the surface of the substrate. The pattern may expose areas of the substrate surface for placement of IC dies. A water-based solution is then applied to the exposed areas such that droplets form on the exposed areas of the substrate surface. IC dies are placed on the droplets of the water-based solution, which can cause the IC dies to align with the exposed areas of the substrate surface. The droplets are then caused to evaporate such that the IC dies settle on the exposed areas of the substrate surface.

20 Claims, 9 Drawing Sheets

METHODS AND APPARATUS FOR SELF-ALIGNMENT OF INTEGRATED CIRCUIT DIES

CROSS REFERENCE TO RELATED APPLICATION

This present disclosure claims priority to U.S. Provisional Patent Application Ser. No. 62/383,921 filed Sep. 6, 2016, the disclosure of which is incorporated by reference herein in its entirety.

BACKGROUND

The background description provided herein is for the purpose of generally presenting the context of the disclosure. Unless otherwise indicated herein, the approaches described in this section are not prior art to the claims in this disclosure and are not admitted to be prior art by inclusion in this section.

During most chip manufacturing processes, integrated circuit (IC) dies are singulated (e.g., separated) from a silicon wafer and mounted to a die carrier for subsequent processing. Mounting the IC dies to the die carrier, however, often requires a high level of accuracy to ensure correct placement of the dies with respect to each other or the die carrier itself. Typical IC die mounting equipment and machines rely on mechanical capability to achieve this level of die placement accuracy. Because of this reliance on mechanical capability, which is often slow and time consuming, these IC die mounting equipment and machines have low throughput with respect to populating the die carriers. The low throughput of these machines not only slows down the chip manufacturing, but also increases manufacturing costs associated with each chip due to the prolonged amount of time that each IC die spends in the die mounting machines and associated equipment.

SUMMARY

This summary is provided to introduce subject matter that is further described in the Detailed Description and Drawings. Accordingly, this Summary should not be considered to describe essential features nor used to limit the scope of the claimed subject matter.

In some aspects, a method is described that deposits, on a surface of a substrate, a hydrophobic material for form a pattern on the surface of a substrate. The pattern may be configured or predefined to expose areas of the substrate surface for placement of integrated circuit (IC) dies. A water-based solution is applied to the exposed areas such that droplets form on the exposed areas of the substrate surface. The method places IC dies on the droplets of the water-based solution, which may cause the IC dies to align with the exposed areas of the substrate surface. The droplets are then caused to evaporate such that the IC dies settle on the exposed areas of the substrate surface.

In other aspects, an apparatus is described that includes a fixture to support an IC die carrier. A first module of the apparatus is configured to deposit, on a surface of the IC die carrier, a hydrophobic material to form a pattern on the surface of the IC die carrier. The pattern of hydrophobic material exposes hydrophilic areas of the surface of the IC die carrier. A second module is configured to apply droplets of a water-based solution to the exposed hydrophilic areas of the surface of the IC die carrier and a third module configured to place IC dies on the droplets of water-based solution.

A fourth module of the apparatus is configured to heat the IC die carrier effective to cause the droplets of the water-based solution to evaporate such that the IC dies settle on the exposed areas of the surface of the IC die carrier.

In yet other aspects, a method is described that deposits, on an adhesive layer of an IC die carrier, a hydrophobic material to form a pattern on the adhesive layer. The pattern may define areas of the adhesive layer for receiving IC dies, wherein the adhesive layer is hydrophilic. Water is then applied to the defined areas of the adhesive layer such that droplets of the water form on the defined areas of the adhesive layer of the IC carrier. The method places IC dies on the water droplets such that surface tension of the droplets align the IC dies with the defined areas of the adhesive layer of the IC carrier. The IC die carrier and water droplets are then heated effective to cause the water droplets to evaporate and the aligned IC dies to settle on the defined areas of the adhesive layer of the IC carrier.

The details of one or more implementations are set forth in the accompanying drawings and the following description. Other features and advantages will be apparent from the description and drawings, and from the claims.

BRIEF DESCRIPTION OF THE DRAWINGS

The details of one or more aspects for implementing self-alignment of integrated circuit dies are set forth in the accompanying figures and the detailed description below. In the figures, the left-most digit of a reference number identifies the figure in which the reference number first appears. The use of the same reference numbers in different instances in the description and the figures may indicate like elements.

DETAILED DESCRIPTION

Conventional techniques for reconstitution in fan-out packaging often rely on mechanical capabilities of die bonding equipment to achieve a requisite level of accuracy. By way of review, a reconstitution process for fan-out packaging at a wafer-level or panel-level involves singulating integrated circuit (IC) dies from a silicon wafer and reconstituting the dies by placing them on a substrate at lower density. In some cases, the increased substrate area per die enables die size to shrink while enabling a same or greater number of interconnects through the substrate, carrier, or packaging of the die. As noted, conventional techniques for reconstitution rely on mechanical capabilities of die handling machinery to ensure highly accurate placement of the dies during the reconstitution process. These mechanically-reliant die bonding machines, however, are slow and have low throughput, which in turn increases manufacturing time and costs associated with each of the IC dies.

This disclosure describes techniques and apparatuses for self-alignment of IC dies. In some aspects, a hydrophobic material is deposited, on a surface of a substrate to form a pattern of the hydrophobic material. The pattern may expose areas of the substrate surface for placement of the IC dies. A water-based solution is then applied to the exposed areas such that droplets of the water-based solution form on the exposed areas of the substrate surface. The IC dies are placed on the droplets of the water-based solution, which may cause the IC dies to align (e.g., through surface tension) with the exposed areas of the substrate surface. The droplets are then caused to evaporate such that the IC dies settle on the exposed areas of the substrate surface. By so doing, multiple IC dies can be concurrently aligned and settled onto predefined areas of the substrate surface with high accuracy, thereby increasing throughput of a reconstitution process. This increase in throughput also reduces manufacturing time and costs associated with the IC dies, which may in turn lower overall cost of chips or devices in which the IC dies are later embodied.

The following discussion describes an operating environment, techniques that may be employed in the operating environment, and a System-on-Chip (SoC) in which components of the operating environment can be embodied. In the context of the present disclosure, reference is made to the operating environment by way of example only.

Operating Environment

Figure 1:
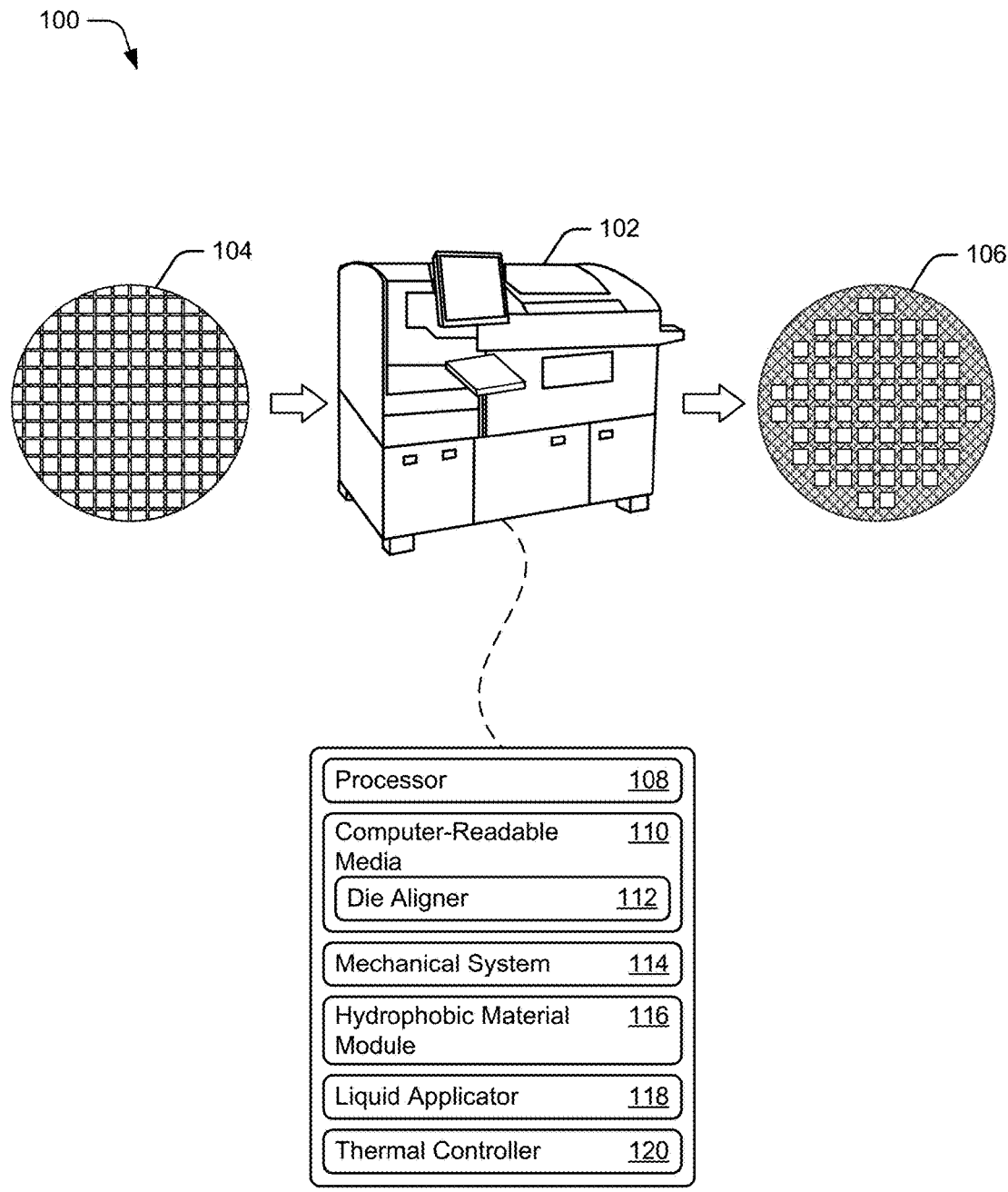
FIG. 1 illustrates an example operating environment that includes an integrated circuit (IC) die bonding device.

FIG. 1 illustrates an example operating environment 100 that includes an example die bonding device 102 in accordance with one or more aspects. In this particular example, the die bonding device 102 is configured to enable fan-out wafer-leveling or panel-leveling packaging processes. In some cases, the die bonding device 102 bonds integrated circuit (IC) dies to a substrate or IC die carrier as part of a reconstitution process. The reconstitution process for fan-out packaging may involve separating (e.g., singulating) IC dies from a silicon wafer 104 and reconstituting the dies by placing them on a substrate 106 at lower density (e.g., reconstituted wafer). Generally, the wafer-level or panel-level reconstitution process increases an amount of substrate area per die, which can enable increased interconnect densities for the IC dies or other advanced chip packaging techniques.

The die bonding device 102 be configured to implement a variety of operations or processes for wafer-level or board-level packaging. For example, the die bonding device 102 can include modules to implement pick and place, chemical vapor deposition, molding, stencil printing, ball-grid placement, singulation, inspection, testing, packing, and so on. The die bonding device 102 may also be capable of processing or handling a variety of wafer panels, panel substrates, IC die carriers, and the like. In some cases, the die bonding device is configured to process wafer substrates up to 12 inches in diameter or panel substrates in sizes up to 330 millimeters by 330 millimeters.

The die bonding device 102 includes a processor 108 and computer-readable media 110. The processor 108 can be any suitable type of processor, either single core or multi-core, for executing instructions or commands of an operating system or application of the die bonding device 102. The computer-readable storage media 110 (CRM 110) includes volatile memory and non-volatile memory for storing various data and instructions of the die bonding device 102. In the context of this disclosure, the CRM 110 is implemented as storage media, and thus does not include transitory signals or carrier waves.

The CRM 110 of the die bonding device 102 includes a die aligner 112 and other various die processing algorithms and applications (not shown). The die aligner 112 may be implemented to manage or control other modules of the die bonding device 102. The die processing algorithms and applications may be executed by the processor 108 to implement various functionalities of the die bonding device 102, such as those described herein. In some cases, the die bonding device 102 includes a display through which a user interface and applications of the die bonding device 102 are presented or accessible. The implementations and uses of the die aligner 112 vary and are described throughout the disclosure.

The die bonding device 102 includes a mechanical system 114 and hydrophobic material module 116. The mechanical system 114 may include working surfaces or fixtures configured to support wafer or panel substrates. In some cases, the mechanical system 114 includes subsystems to enable pick and place functionalities of the die bonding device 102, such as articulating arms or assemblies for placing IC dies or die-attach components on the substrates. The hydrophobic material module 116 is capable of depositing or applying hydrophobic material to a wafer or panel substrate. In some cases, the hydrophobic material module 116 deposits a hydrophobic material to form a preconfigured or predefined pattern. Alternately or additionally, the hydrophobic material module 116 may be configured to provide a layer of hydrophobic material at any suitable thickness, such as approximately one micrometer to 20 micrometers. The implementations and uses of the mechanical system 114 and hydrophobic material module 116 vary, and are described throughout the disclosure.

The die bonding device 102 also includes a liquid applicator 118 and thermal controller 120. The liquid applicator 118 is capable of applying or placing liquids on a substrate or IC die carrier. The liquid applicator 118 may apply or dispense any suitable type of liquid or fluid, such as water, water-based solutions, alcohol-based solutions, and the like. In some cases, the liquid applied by the liquid applicator 118 is phase-changeable or evaporative within an operational temperature range of the die bonding device 102. The thermal controller 120 can control or alter a temperature of a working area of the die bonding device 102. The thermal controller 120 may be configured to implement any suitable temperature algorithm or profile, such as to increase a temperature within the die bonding device 102 to cause liquids to evaporate. The implementations and uses of the liquid applicator 118 and thermal controller 120 vary, and are described throughout the disclosure.

Figure 2:
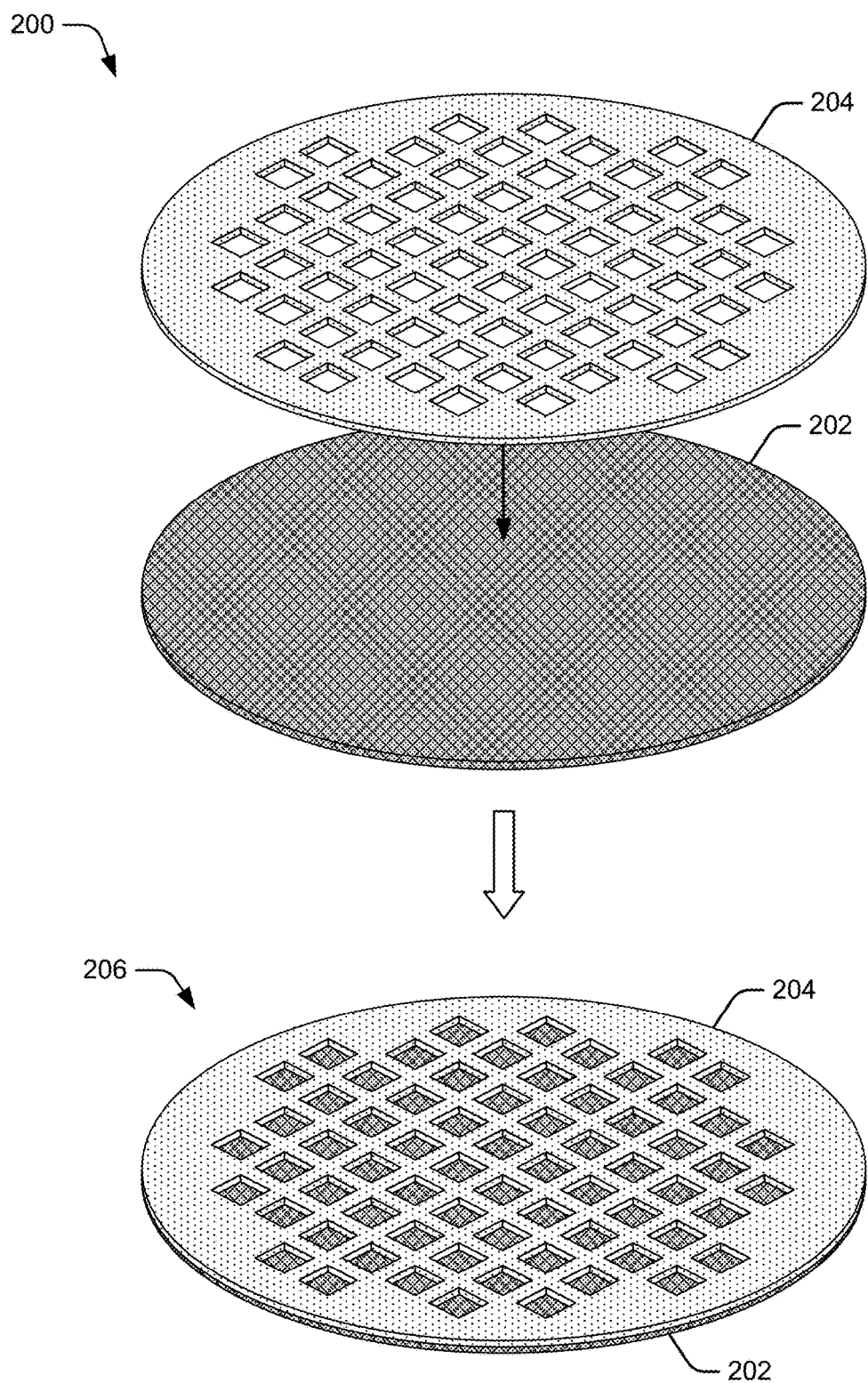
FIG. 2 illustrates examples of a substrate and layer of hydrophobic material in accordance with one or more aspects.

FIG. 2 illustrates examples of a substrate and layer of hydrophobic material in accordance with one or more aspects at 200. In this particular example, the substrate 202 is configured as a silicon wafer that is substantially circular shape. Although referred to as a substrate, the substrate 202 may also be configured as a component carrier, die-attach substrate, IC die carrier, and so on. Alternately or additionally, the substrate may be implemented as a panel or with another material, such as adhesive layers, release layers, glass, metal, or composites.

In some aspects, the hydrophobic material module 116 deposits a layer of hydrophobic material 204 on a surface of the substrate 202. The layer of hydrophobic material 204 may be deposited or applied in a pre-defined pattern that defines areas or locations of the substrate for placement of IC dies. As shown at 206, this pattern or layer of hydrophobic material 204 may resemble a grid-like or waffle structure, which includes cavities to receive the IC dies. In some cases, the cavities of the hydrophobic material 204 are non-circular, such that edges or corners of the cavities are useful to align or orient IC dies. Depositing or applying the hydrophobic material 204 to the substrate 202 may be effective to provide a substrate configured to enable self-alignment of IC dies or other die-attach components. These and other aspects for implementing self-alignment of integrated circuit dies are described in greater detail throughout the disclosure.

Techniques for Self-Alignment of Integrated Circuit Dies

The following discussion describes techniques for self-alignment of integrated circuit (IC) dies. The techniques can be implemented using any of the environments and entities described herein, such as the die aligner 112, hydrophobic material module 116, liquid applicator 118 and/or thermal controller 120. These techniques include methods illustrated in FIGS. 3 and 6, each of which is shown as a set of operations performed by one or more entities. These methods are not necessarily limited to the orders of operations shown. Rather, any of the operations may be repeated, skipped, substituted, or re-ordered to implement various aspects described herein. Further, these methods may be used in conjunction with one another, in whole or in part, whether performed by the same entity, separate entities, or any combination thereof. In portions of the following discussion, reference will be made to operating environment 100 of FIG. 1 and entities of FIG. 2 by way of example. Such reference is not to be taken as limiting described aspects to operating environment 100 but rather as illustrative of one of a variety of examples.

Figure 3:
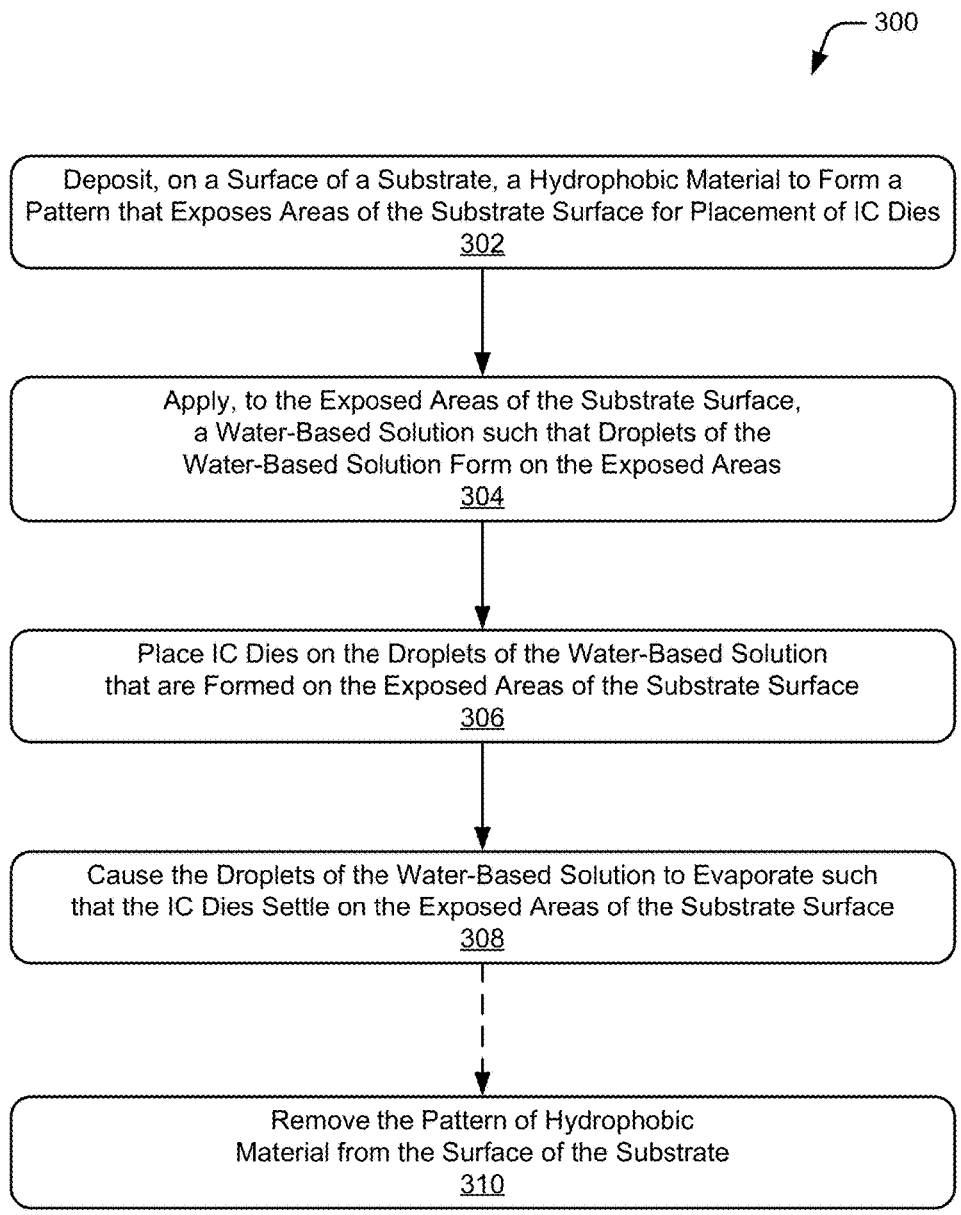
FIG. 3 illustrates an example method for implementing self-aligning IC dies.

FIG. 3 depicts an example method 300 for implementing self-aligning IC dies, including operations performed by the die aligner 112, hydrophobic material module 116, liquid applicator 118 and/or thermal controller 120.

At 302, a hydrophobic material is deposited or applied to a surface of a substrate. The hydrophobic material is deposited or applied to form a pattern on the surface of the substrate. The pattern can be configured to expose or define areas of the substrate surface for placement IC dies. Thus, the areas may be substantially rectangular or square, or configured to approximate a footprint of the IC dies. Additionally, the hydrophobic material may be deposited to any suitable thickness, such as five micrometers to 15 micrometers. In some cases, the hydrophobic material includes silicon nitride, silicon oxide, polyimide, and the like. The pattern of hydrophobic material may be formed or deposited on the substrate using any suitable operations, such as masking, etching, oxidizing, chemical vapor deposition (e.g., low-pressure chemical vapor deposition (LPCVD)), or a combination thereof.

The substrate on which the pattern of hydrophobic material is formed may be configured as a wafer or panel formed from silicon, glass, metal, and the like. In some cases, the surface of the substrate includes a layer of release material or a layer of adhesive material, which can enable the bonding of IC dies. Alternately or additionally, the surface of the substrate may be hydrophilic, such that water or water-based solutions are attracted to the surface of the substrate (or adhesive layer residing thereon).

Figure 4:
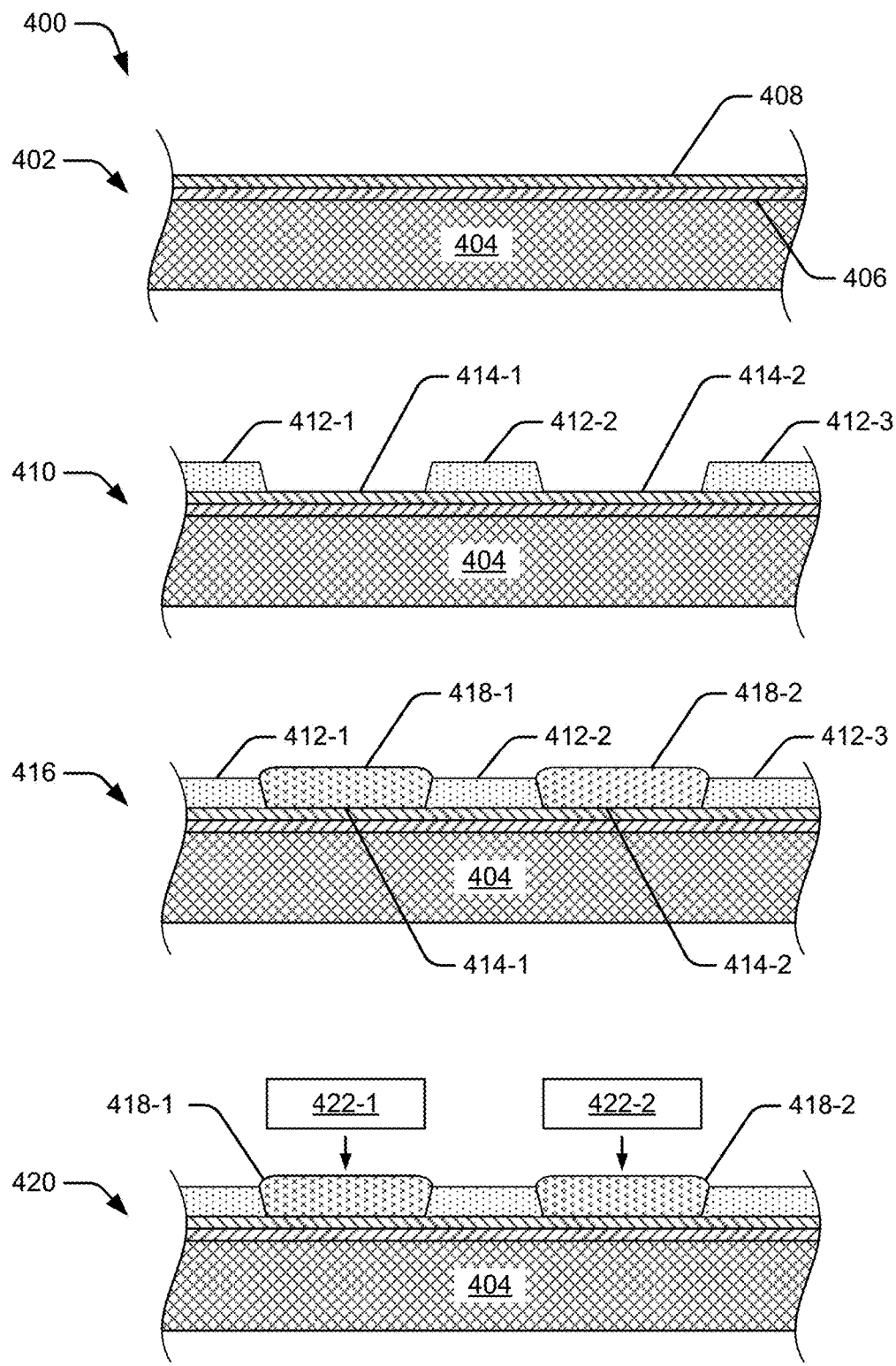
FIG. 4 illustrates cross-sections of an example substrate configured in accordance with one or more aspects.

By way of example, consider FIG. 4 which illustrates cross-sections of an example substrate configured for aspects of self-alignment of IC dies at 400. An example configuration of a substrate is shown at 402, which includes a substrate 404, a release layer 406, and an adhesive layer 408. Here, assume that the substrate 404 is supported by a mechanical fixture of the die bonding device 102 and will be used as an IC die carrier for a reconstitution process for fan-out wafer-level packaging. In this particular example, the substrate 404 is formed from glass and the adhesive layer 408 is formed from a hydrophilic material. In the context of method 300 and as shown at 410, the die aligner 112 can control the hydrophobic material module 116 to deposit a hydrophobic material 412 to form a pattern on the adhesive layer 408 of the substrate 404. The pattern of the hydrophobic material 412 includes regions 412-1, 412-2, and 412-3, which expose areas 414-1 and 414-2 of the adhesive layer 408 for placement of IC dies.

At 304, a water-based solution is applied to the exposed areas of the substrate such that droplets of the water-based solution form on the exposed areas. Although referred to as a water-based solution, the water-based solution may include water or a mixture of water and other chemicals, such as those useful to bond IC dies to the substrate or alter a boiling point of the solution. The water-based solution can be sprayed, misted, or applied directly to the exposed areas of the substrate surface. The water-based solution or droplets may be applied to any suitable thickness, such as approximately five micrometers to 30 micrometers. In some cases, the pattern of hydrophobic material on the surface of the substrate causes the water-based solution to coalesce or merge on the exposed areas. Alternately or additionally, the droplets may form on the exposed areas due to surface tension of the water-based solution.

In the context of the present example and as shown at 416, the die aligner 112 controls the liquid applicator 118 to apply a water-based solution 418 to the areas 414 of the substrate 404. Specifically, a droplet 418-1 of the water-based solution forms on area 414-1 of the adhesive layer and droplet 418-2 of the water-based solution forms on area 414-2 of the adhesive layer, which is hydrophilic. Here, note that the surface tension of the water-based solution permits the solution to form droplets in the respective areas at a height slightly above adjacent portions of the hydrophobic material.

At 306, IC dies are placed on the droplets of the water-based solution that reside on the exposed areas of the substrate surface. A geometry of underlying substrate may be configured, via the pattern of hydrophobic material, such that a geometry of the droplet approximates a foot print of the IC dies. In some cases, surface tension of the water-based solution supports the IC dies, which may also by hydrophobic, or causes the IC dies to align with the exposed areas of the substrate or adhesive layer beneath the droplet. Thus, the IC dies may be placed with less accuracy than conventional IC placement techniques because the surface tension of the droplets can be used to pull or align the IC dies with the exposed or target areas of the substrate. The dies can be placed on the droplets via any suitable system of a die processing or bonding device, such as a pick and place system.

Figure 5:
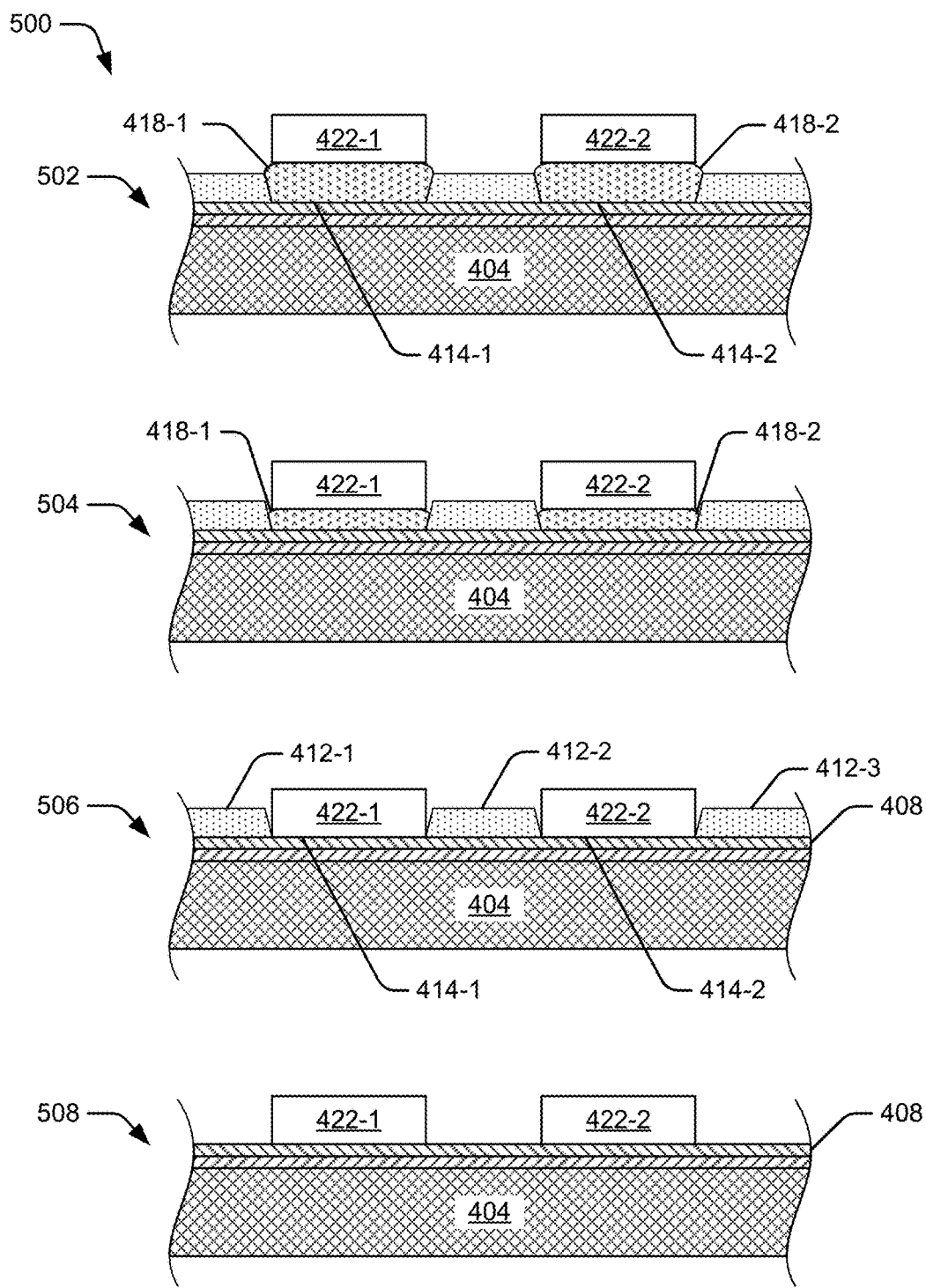
FIG. 5 illustrates cross-sections of an example substrate on which droplets reside and IC dies are placed.

Continuing the ongoing example and as shown at 420, the die aligner 112 uses the mechanical system 114 of the die bonding device 102 to place IC dies 422-1 and 422-2 on droplets 418-1 and 418-2, respectively, of the water-based solution, respectively. Because surface tension of the droplets 418-1 and 418-2 of the water-based solution will pull or align the IC dies 422-1 and 422-2 with the exposed areas 414-1 and 414-2, respectively, of the adhesive layer 408, the placement of the IC dies may be less accurate than conventional techniques, and therefore faster than conventional mechanical placement systems. Next consider FIG. 5, which illustrates additional cross-sections of the substrate 404 and the IC dies 422-1 and 422-2 at 500. As shown at 502, the surface tension of the droplets 418-1 and 418-2 of the water-based solution support the IC dies 422-1 and 422-2, respectively. Additionally, a geometry of the exposed areas 414-1 and 414-2 and the surface tension cause the IC dies 422-1 and 422-2 to self-align with the areas 414-1 and 414-2, respectively, that are exposed or defined by the hydrophobic material 412.

At 308, the droplets of the water-based solution are caused to evaporate. This can be effective to cause the IC dies to settle on the exposed areas of the substrate surface or layer of adhesive material. In some cases, the water-based solution is caused to evaporate by applying heat to, or increasing the temperature of, the substrate and droplets of water-based solution. In such cases, the substrate can be lightly and/or slowly baked to cause the droplets of the water-based solution to evaporate. The temperature of a die bonding machine may also be controlled such that the droplets do not bubble or boil, to prevent the IC dies from becoming unaligned or misaligned during the evaporation process. For example, setting the temperature of the die bonding machine from approximately 80 degrees Celsius to 99 degrees Celsius may effectively evaporate the droplets without boiling the water-based solution.

In the context of the present example, the die aligner 112 activates the thermal controller 120 of the die bonding device 102 to heat the substrate 404. As the droplets 418-1 and 418-2 of the water-based solution evaporate as shown at 504, the self-aligned IC dies 422-1 and 422-2 begin to descend or settle into respective cavities formed by the hydrophobic material 412. Once the droplets 418-1 and 418-2 of the water-based solution evaporate completely as shown at 506, the self-aligned IC dies 422-1 and 422-2 settle onto the exposed areas 414-1 and 414-2 of the adhesive layer 408. In some cases, this is effective to adhere the self-aligned IC dies 422-1 and 422-2 to the exposed areas 414-1 and 414-2, respectively, of the substrate for further processing.

Optionally at 310, the pattern of hydrophobic material is removed from the surface of the substrate. In some cases, the pattern of hydrophobic material is removed from the substrate before proceeding with subsequent substrate or fan-out processing (e.g., die-down or die-up operations). The pattern of hydrophobic material may be removed using any suitable process, such as an acid bath, acid wash, etching, polishing, and so on. Concluding the present example, the hydrophobic material regions 412-1, 412-2, and 412-3, are removed from the substrate 404, leaving the self-aligned IC dies 422-1 and 422-2 placed on the substrate 404 as shown at 508.

Figure 6:
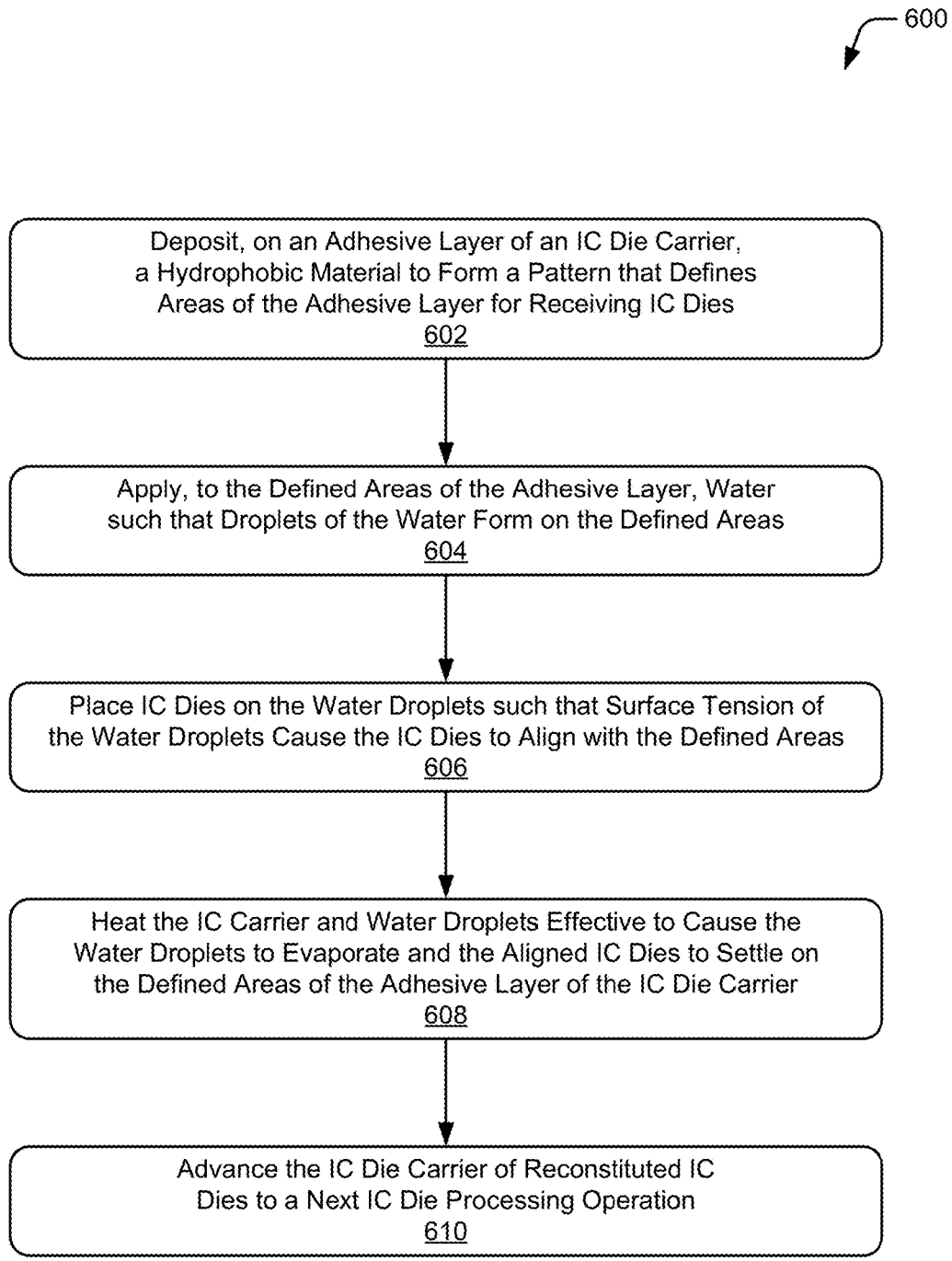
FIG. 6 illustrates an example method for using water droplets to cause IC dies to self-align to an IC die carrier.

FIG. 6 depicts an example method 600 for using water droplets to cause IC dies to self-align to areas of an IC die carrier, including operations performed by the die aligner 112, hydrophobic material module 116, liquid applicator 118 and/or thermal controller 120.

At 602, a hydrophobic material is deposited to form a pattern on an adhesive layer of an IC die carrier. The pattern of hydrophobic material may define areas of the adhesive layer for receiving IC dies. Thus, the areas may be substantially rectangular or square, or configured to approximate a footprint of the IC dies. Additionally, the hydrophobic material may be deposited with any suitable thickness, such as 10 micrometers to 20 micrometers. In some cases, the hydrophobic material includes silicon nitride, silicon oxide, polyimide, and the like. The pattern of hydrophobic material may be formed or deposited on the substrate using any suitable combination of operations, such as masking, etching, oxidizing, or chemical vapor deposition (e.g., low-pressure chemical vapor deposition (LPCVD)).

By way of example, consider the substrate 202 of FIG. 2, which is configured as a silicon wafer. Here, assume that the substrate 202 is being used as a reconstitution wafer for IC dies. The hydrophobic material module 116 of the die bonding device 102 is used to deposit a layer of hydrophobic material 204 on the substrate 202 to provide the substrate with a pattern of the hydrophobic material. In this example, the pattern of the hydrophobic material is configured to place IC dies on the substrate 202 as part of a fan-out reconstitution process, though other processes may be implemented through aspects described herein.

Figure 7:
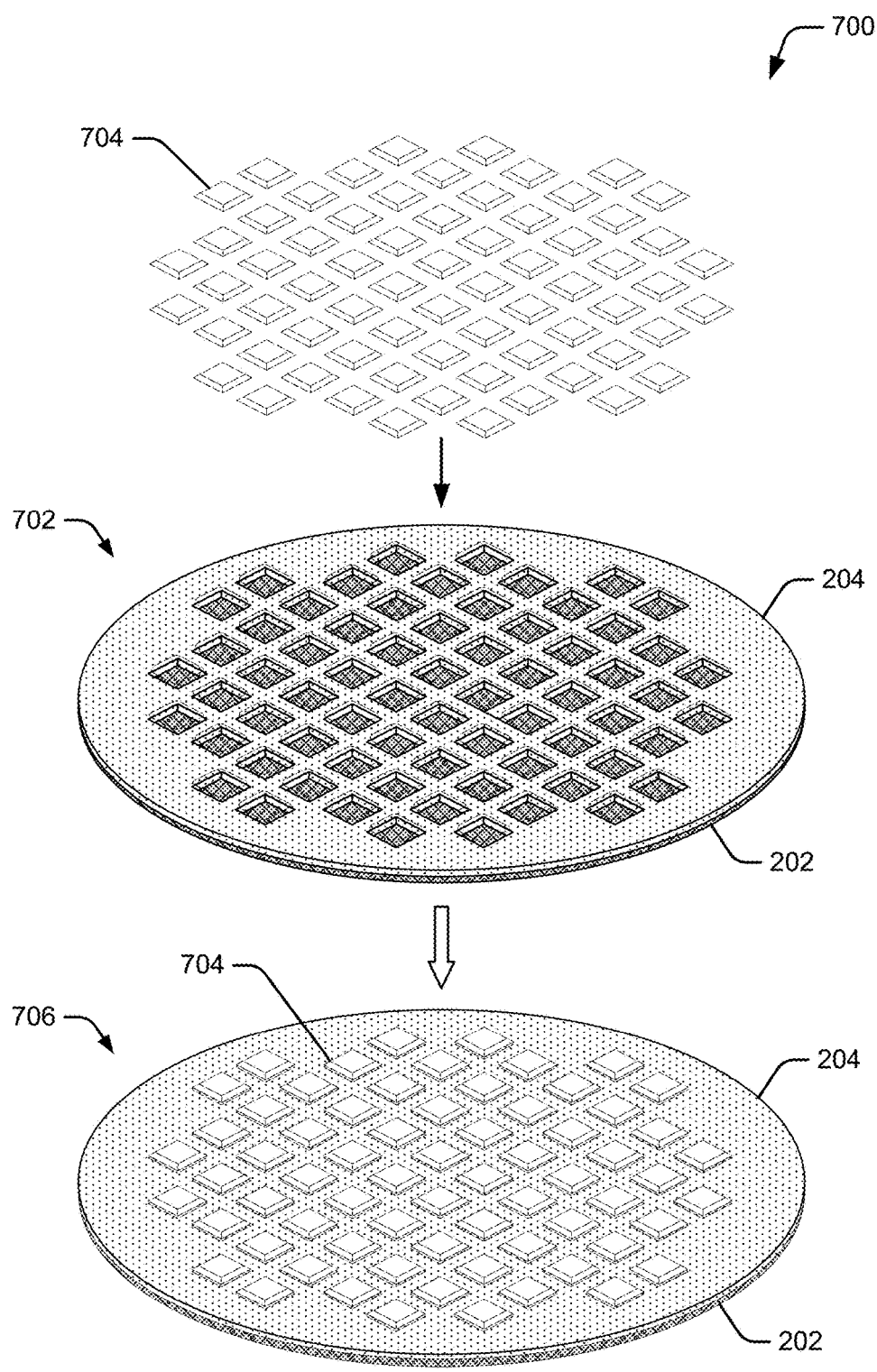
FIG. 7 illustrates examples of a substrate with a layer of hydrophobic material and placement of self-aligning of IC dies on the substrate.

At 604, water is applied to the areas of the adhesive layer defined by the pattern of hydrophobic material. The water applied to the areas of the adhesive layer, or substrate in the absence of adhesive, form droplets that may approximate the shape of cavities in the pattern of hydrophobic material. The water may be applied via any suitable type of operation, such as spraying, misting, dispensing, flowing, screening, wiping (e.g., removing excess water), and so on. In some cases, the water droplets form to a height or thickness approximately level with or slightly above that of the hydrophobic material (e.g., ~10 micrometers to 15 micrometers). Alternately or additionally, the pattern of hydrophobic material and a hydrophilic nature of the substrate or adhesive may cause the water to coalesce or gather on the exposed areas to form the droplets. Continuing the present example, consider FIG. 7 which illustrates a substrate with a layer of hydrophobic material and placement of self-aligning of IC dies generally at 700. Here, water is applied to the substrate 202 and hydrophobic material 204 such that water droplets form in cavities of the pattern of hydrophobic material 204 and/or on the exposed areas of the substrate 202 as shown at 702.

At 606, IC dies are placed on the water droplets. This can cause the IC dies to align with the defined areas, which are bound by the hydrophobic material. Thus, the IC dies may be placed with less accuracy than conventional IC placement techniques because the surface tension of the droplets can be used to pull and/or align the IC dies with the exposed areas (e.g., target placement areas) of the substrate. A geometry of underlying substrate may be configured, via the pattern of hydrophobic material, such that a geometry of the droplet approximates a foot print of the IC dies. In some cases, the dies are placed on the droplets via a pick and place system of a die bonding or processing device. In the context of the ongoing example, IC dies 704 are placed on the water droplets formed by the pattern of hydrophilic material on the substrate 206. As shown at 706, the IC dies 704 are supported by and self-align with the water droplets such that they are positioned over exposed areas of the substrate 202.

At 608, the IC die carrier and water droplets are heated effective to cause the water droplets to evaporate. As the water droplets evaporate, the aligned IC dies may settle on the defined areas of the adhesive layer of the IC die carrier. The heat applied or temperature may be controlled such that the droplets do not bubble or boil, to prevent the IC dies from becoming unaligned or misaligned during the evaporation process. For example, setting or maintaining a temperature of a die bonding machine from approximately 80 degrees Celsius to 99 degrees Celsius may effectively evaporate the droplets without boiling the water-based solution.

Figure 8:
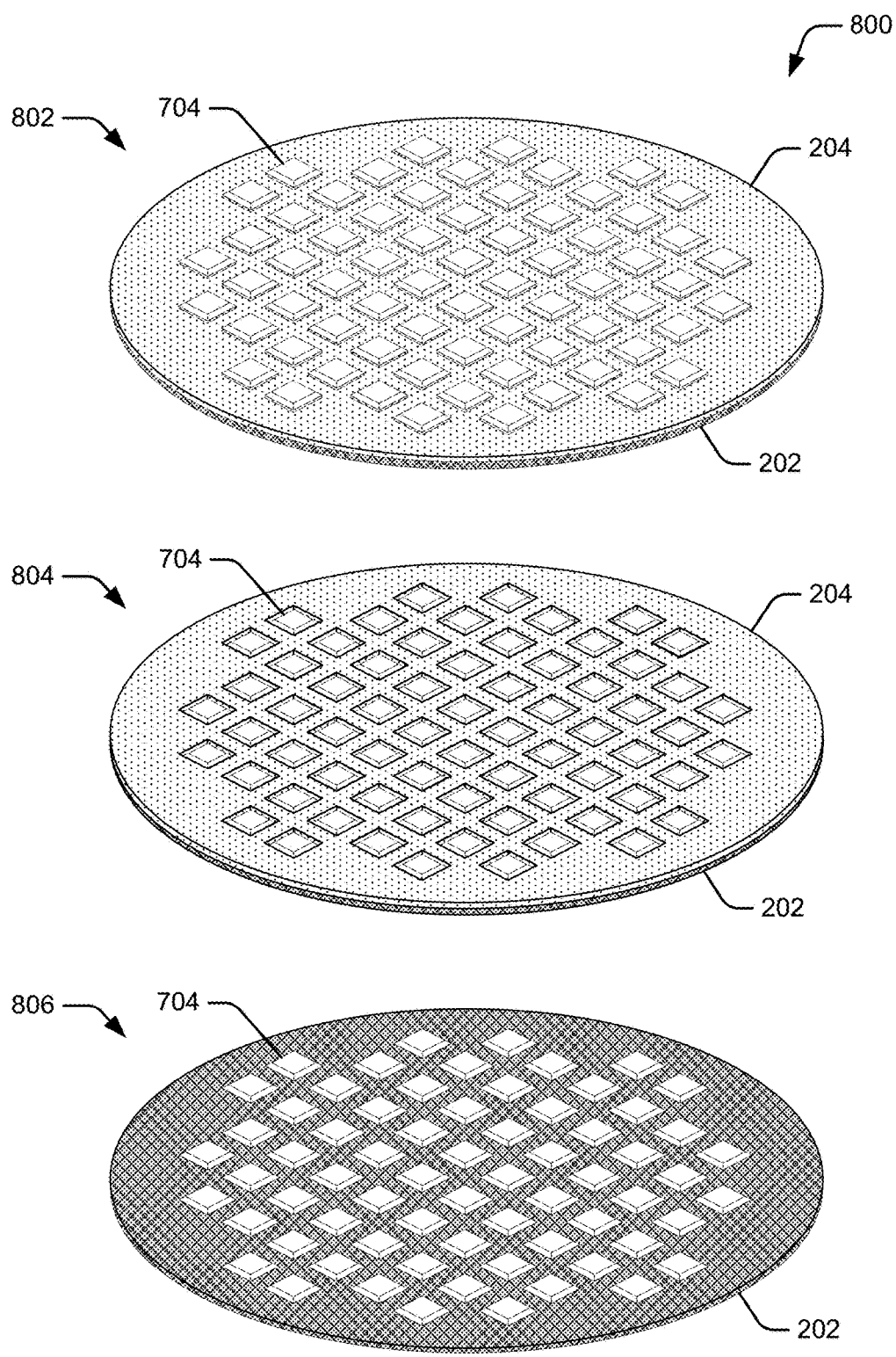
FIG. 8 illustrates an example of settling self-aligned IC dies onto a substrate in accordance with one or more aspects.

Consider FIG. 8, which illustrates settling the IC dies 704 onto the substrate 202 generally at 800. As shown at 802, the IC dies 704 are placed or rest on water droplets formed by the substrate 202 and hydrophobic material 204. In the context of the present example, a thermal controller 120 increases a temperature of a work area in which the substrate 202 resides to approximately 90 degrees Celsius, causing the water droplets evaporate. As shown at 804, as the droplets evaporate, the IC dies 704 settle onto areas of the substrate 202 defined or exposed by the hydrophobic material 204.

At 610, the IC die carrier of reconstituted IC dies is advanced to a next IC die processing operation. This next IC die processing operation may include any suitable type of operation, such as a die-up operation, a die-down down operation, solder ball attachment, singulation, forming a redistribution layer on the substrate or IC die, and the like. Alternately or additionally, the pattern of hydrophobic material may be removed prior to proceeding so a subsequent IC die processing operation. Concluding the present example, the hydrophobic material 204 is removed from the substrate at 806, thereby leaving the reconstituted IC dies 704 on the substrate 202 and ready for subsequent processing.

System-on-Chip

Figure 9:
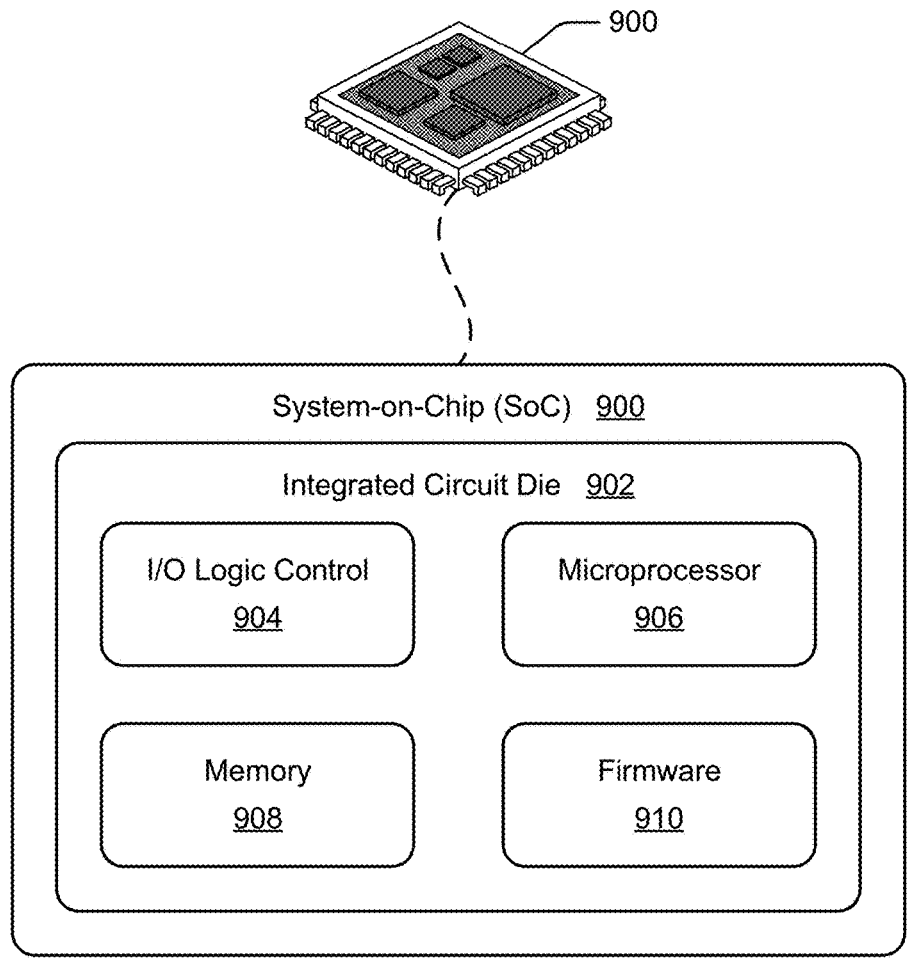
FIG. 9 illustrates an example System-on-Chip (SoC) that may be implemented with an IC die.

FIG. 9 illustrates an exemplary System-on-Chip (SoC) 900 that may be implemented with an IC die 902 provided by the apparatus or techniques described herein. The SoC 900 can be implemented in any suitable device, such as a smart-phone, cellular phone, netbook, tablet computer, server, wireless router, network-attached storage, camera, smart appliance, printer, a set-top box, or any other suitable type of device. Although described with reference to a SoC, the IC die 902 may also be implemented in a network interface controller (NIC), system-in-package (SIP), application-specific standard part (ASSP), digital signal processor (DSP), programmable SoC (PSoC), or field-programmable gate array (FPGA).

The IC die 902 can be integrated with electronic circuitry, a microprocessor, memory, input-output (I/O) logic control, communication interfaces, other hardware, firmware, and/or software useful to provide functionalities of a device, such as any of the devices listed herein. Although shown as implemented on the single IC die 902, components of the SoC 900 may be implemented on multiple IC dies. The SoC 900 may also include an integrated data bus (not shown) that couples the multiple IC dies or various components of the SoC 900 for data communication between the components. The integrated data bus or other components of the SoC 900 may be exposed or accessed through various external ports or data buses.

In this example, the IC die 902 includes various components such as input-output (I/O) logic control 904 (e.g., to include electronic circuitry) and a microprocessor 906 (e.g., any of a microcontroller, processor core, application processor, or DSP). The IC die 902 also includes memory 908, which can be any type and/or combination of RAM, SRAM, DRAM, low-latency nonvolatile memory, ROM, one-time programmable (OTP) memory, and/or other suitable electronic data storage. Alternately or additionally, the IC die 902 may comprise a data interface (not shown) for accessing additional or expandable off-chip memory, such as external SRAM or flash memory. In some cases, the SoC 900 or IC die 902 includes various applications, operating systems, and/or software, such as firmware 910, which can be computer-executable instructions maintained by memory 908 and executed by microprocessor 906. The IC die 902 may also include other various memory interfaces and components embodied as hardware, firmware, software, or any suitable combination thereof.

The IC die 902, either independently or in combination with other entities of the SoC 900, can be implemented with any suitable combination of components or circuitry to implement various aspects and/or features of entities or devices described herein. The IC die 902 may also be provided integral with other entities of the SoC 900, such as integrated with an I/O logic interface, a network interface controller, or power system of the SoC 900. Alternately or additionally, the IC 902 and the other components can be implemented as hardware, firmware, fixed logic circuitry, or any combination thereof.

Although the subject matter has been described in language specific to structural features and/or methodological operations, it is to be understood that the subject matter defined in the appended claims is not necessarily limited to the specific features or operations described herein, including orders in which they are performed.

What is claimed is:

1. A method comprising:
   depositing, on a surface of a substrate, a hydrophobic material to form a pattern that exposes areas of the substrate surface for placement of integrated circuit (IC) dies;
   applying, to the exposed areas of the substrate surface, a water-based solution such that droplets of the water-based solution form on the exposed areas of the substrate surface;
   placing IC dies on the droplets of the water-based solution that are formed on the exposed areas of the substrate surface; and
   causing the droplets of the water-based solution to evaporate such that the IC dies settle on the exposed areas of the substrate surface.

2. The method as recited in claim 1, wherein placing the IC dies on the droplets of the water-based solution is effective to cause the IC dies to self-align with the exposed areas of the substrate surface.

3. The method as recited in claim 1, wherein causing the droplets of the water-based solution to evaporate includes applying heat to the substrate or droplets of the water-based solution.

4. The method as recited in claim 1, wherein the exposed areas of the substrate have a shape that is substantially rectangular or square.

5. The method as recited in claim 1, wherein the pattern in which the hydrophobic material is formed is configured such that the exposed areas of the substrate surface substantially match a footprint of the IC dies.

6. The method as recited in claim 1, wherein a thickness of the hydrophobic material deposited on the substrate surface ranges from approximately one micrometer to 20 micrometers.

7. The method as recited in claim 1, wherein:
   the substrate surface comprises a layer of adhesive material; and wherein the method further comprises:
      depositing the hydrophobic material on the layer of adhesive material; and
      causing the droplets of water-based solution to evaporate is effective to adhere, via the layer of adhesive material, the IC dies to the exposed areas of the substrate surface.

8. The method as recited in claim 1, wherein the hydrophobic material comprises silicon nitride or silicon oxide.

9. The method as recited in claim 1, wherein the substrate surface or an adhesive layer residing on the substrate surface is hydrophilic.

10. An apparatus comprising:
- a fixture to support an integrated circuit (IC) die carrier;
- a first module configured to deposit, on a surface of the IC die carrier, a hydrophobic material to form a pattern on the surface of the IC die carrier, the pattern exposing hydrophilic areas of the surface of the IC die carrier;
- a second module configured to apply droplets of a water-based solution to the exposed hydrophilic areas of the surface of the IC die carrier;
- a third module configured to place IC dies on the droplets of water-based solution; and
- a fourth module configured to heat the IC die carrier effective to cause the droplets of the water-based solution to evaporate such that the IC dies settle on the hydrophilic areas of the surface of the IC die carrier.

11. The apparatus as recited in claim 10, wherein placing the IC dies on the droplets of the water-based solution is effective to cause the IC to self-align with the exposed hydrophilic areas of the surface of the IC die carrier.

12. The apparatus as recited in claim 10, wherein:
- the first module is further configured to deposit the hydrophobic material on the surface of the IC die carrier with a thickness of approximately one micrometer to 20 micrometers; or
- the second module is further configured to apply droplets of a water-based solution such that the droplets have a thickness of approximately five micrometers to 30 micrometers.

13. The apparatus as recited in claim 10, wherein a shape of the exposed hydrophilic areas of the surface of the IC die carrier are substantially rectangular or square.

14. The apparatus as recited in claim 10, wherein the substrate surface comprises a layer of adhesive material and causing the droplets of the water-based solution to evaporate is effective to adhere, via the layer of adhesive material, the IC dies to the exposed hydrophilic areas of the surface of the IC die carrier.

15. The apparatus as recited in claim 10, wherein the hydrophobic material deposited on the surface of the IC die carrier includes silicon nitride or silicon oxide.

16. The apparatus as recited in claim 10, wherein the IC die carrier comprises glass, metal, or silicon.

17. A method comprising:
- depositing, on an adhesive layer of an integrated circuit (IC) die carrier, a hydrophobic material to form a pattern that defines areas of the adhesive layer for receiving IC dies, the adhesive layer being hydrophilic;
- applying, to the defined areas of the adhesive layer, water such that droplets of the water form on the defined areas of the adhesive layer of the IC carrier;
- placing IC dies on the water droplets such that surface tension of the water droplets cause the IC dies to align with the defined areas of the adhesive layer of the IC carrier; and
- heating the IC die carrier and water droplets effective to cause the water droplets to evaporate and the aligned IC dies to settle on the defined areas of the adhesive layer of the IC die carrier.

18. The method as recited in claim 17, wherein the areas of the adhesive layer defined by the pattern of hydrophobic material approximate a footprint of respective ones of the IC dies.

19. The method as recited in claim 17, wherein the hydrophobic material deposited on the adhesive layer comprises silicon oxide or silicon nitride, and the pattern of the hydrophobic material is formed to a thickness of approximately one micrometer to 20 micrometers.

20. The method as recited in claim 17, wherein in the IC carrier is configured as a wafer or panel, and the method is implemented as part of a fan-out wafer or fan-out panel die bonding process.

* * * * *